(12) United States Patent
Budell et al.

(10) Patent No.: US 6,945,791 B2
(45) Date of Patent: Sep. 20, 2005

(54) INTEGRATED CIRCUIT REDISTRIBUTION PACKAGE

(75) Inventors: Timothy W. Budell, Milton, VT (US); Eric W. Tremble, Jericho, VT (US); Brian P. Welch, Scotia, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/776,737

(22) Filed: Feb. 10, 2004

(65) Prior Publication Data

US 2005/0176273 A1 Aug. 11, 2005

(51) Int. Cl.[7] ............................................. H01R 12/00
(52) U.S. Cl. .......................................... 439/71; 439/66
(58) Field of Search ....................................... 439/66, 71

(56) References Cited

U.S. PATENT DOCUMENTS

| | | | |
|---|---|---|---|
| 3,226,669 A * | 12/1965 | Lutz | 439/715 |
| 3,795,037 A * | 3/1974 | Luttmer | 29/883 |
| 3,954,317 A * | 5/1976 | Gilissen et al. | 439/591 |
| 4,295,700 A * | 10/1981 | Sado | 439/91 |
| 4,793,814 A * | 12/1988 | Zifcak et al. | 439/66 |
| 4,871,316 A * | 10/1989 | Herrell et al. | 439/66 |
| 5,531,022 A * | 7/1996 | Beaman et al. | 29/850 |
| 6,008,530 A | 12/1999 | Kano | |
| 6,078,500 A * | 6/2000 | Beaman et al. | 361/704 |
| 6,332,782 B1 * | 12/2001 | Bezama et al. | 439/66 |
| 6,376,904 B1 | 4/2002 | Haba et al. | |
| 6,445,066 B1 | 9/2002 | Miller | |
| 6,459,039 B1 * | 10/2002 | Bezama et al. | 174/52.4 |
| 6,712,621 B2 * | 3/2004 | Li et al. | 439/65 |
| 2003/0051910 A1 | 3/2003 | Dyke et al. | |
| 2003/0160293 A1 | 8/2003 | Iadanza | |
| 2004/0023529 A1 * | 2/2004 | Howell et al. | 439/71 |

* cited by examiner

Primary Examiner—Tho D. Ta
Assistant Examiner—Larisa Tsukerman
(74) Attorney, Agent, or Firm—George R. McGuire; Bond Schoeneck & King, PLLC (57) ABSTRACT

The present invention provides a redistribution package having an upper surface that includes contacts with reduced pitch that correspond, for example, to that of a Controlled Collapse Chip Connection ("C4") structure formed on a chip, and a lower surface having contacts with increased pitch that correspond, for example, to a printed circuit board employing ball grid array ("BGA") pads. A series of power, signal and ground conductors extend through the body of the redistribution package and interconnect the circuit board contacts to the chip contacts.

15 Claims, 6 Drawing Sheets

INTEGRATED CIRCUIT REDISTRIBUTION PACKAGE

BACKGROUND OF THE INVENTION

1. Field of the Invention

This invention relates to the field of integrated circuit chip packaging, and more specifically to devices for connecting an integrated circuit chip to a printed circuit board.

2. Description of Prior Art

Integrated circuit chips have a large number of pins that must be connected to a circuit board. The circuit board sends and receives signals from the integrated circuit chip and also provides power and ground for the chip. Integrated circuit chips are small in comparison to circuit boards and typically have pins that are separated by 100 μm to 200 μm. The circuit boards to which integrated circuit chips are connected have connector pads that typically are separated by no less than approximately 1 mm.

It is necessary to provide means for connecting the closely-spaced contacts of integrated circuit chips to the more widely-spaced contacts of a circuit board. The connections between the chip and the printed circuit board include ground, power and signal. To maintain separation between signal paths, typical architecture requires one or more signal layers, separated from each other by one or more power planes or ground planes to reduce signal interference. Signal, ground and power layers are electrically isolated from each other by interposed layers of dielectric. Typical redistribution packages comprise closely-spaced contacts that match the contacts of an integrated circuit chip and communicate electrically with the traces on the otherwise isolated signal layers, ground layers and power layers by vias. The traces on different signal, ground and power layers are connected to traces on respective other signal, ground and power layers through the use of vias that provide electrical communication between otherwise isolated layers. The signal, ground and power layers are also connected by vias to more widely-spaced contacts of the redistribution package that communicate with contacts on the circuit board.

Signal vias, however, can generate "cavity noise" that results from the interruption of displacement current whenever switching activity occurs thereon. In addition, these prior art coplanar redistribution packages often suffer from signal noise due to signal coupling.

3. Objects and Advantages

It is therefore a principal object and advantage of the present invention to provide a redistribution package that permits connection of a chip to a printed circuit board without generating cavity noise.

It is an additional object and advantage of the present invention to provide a redistribution package that does not utilize signal vias.

It is a further object and advantage of the present invention to provide a redistribution package that diminishes the likelihood of noise coupling in the package.

Other objects and advantages of the present invention will in part be obvious, and in part appear hereinafter.

SUMMARY OF THE INVENTION

In accordance with the foregoing objects and advantages, the present invention provides a redistribution package having an upper surface that includes contacts with reduced pitch that corresponds, for example, to that of a Controlled Collapse Chip Connection ("C4") structure formed on a chip, and a lower surface having contacts with increased pitch that correspond, for example, to a printed circuit board employing ball grid array ("BGA") pads. A series of power, signal and ground conductors extend through the body of the redistribution package and interconnect the circuit board contacts to the chip contacts.

In one aspect, the redistribution package of the present invention comprises a truncated pyramidal shaped body having four sloping, lateral sides extending between planar upper and lower contact surfaces. The upper surface, preferably rectangular in form, is parallel to and proportionately smaller than the bottom surface, which is also preferably rectangular in form. Conductors extending through the body at a plurality of angles interconnect the contacts on the top surface to the contacts on the bottom surface. A chip having contacts that are arranged in the same pattern as the contacts on the upper surface is electrically connected to the upper surface, while an integrated circuit board having contacts arranged in the same pattern as the contacts on the lower surface of the redistribution package is electrically connected to the lower surface. Signal carrying conductors, ground conductors, and power conductors extend through the body at a plurality of angles and interconnect respective pairs of lower surface contacts with upper surface contacts. Each signal carrying conductor is surrounded on all four sides by ground conductors to eliminate signal coupling and cavity noise.

In another aspect of the invention, the structure of the redistribution package is modified to include a power plane that is coextensive with and parallel to the upper surface of the redistribution package. A plurality of power conductors extend through the redistribution package to carry power from the integrated circuit board to the power plane and ultimately to the chip. A plurality of vias are formed through the power plane and provide electrically isolated passageways for the ground and signal carrying conductors which extend between the upper and lower surfaces of the redistribution package.

BRIEF DESCRIPTION OF THE DRAWINGS

The present invention will be more fully understood and appreciated by reading the following Detailed Description in conjunction with the accompanying drawings, in which.

DETAILED DESCRIPTION

Figure 1:
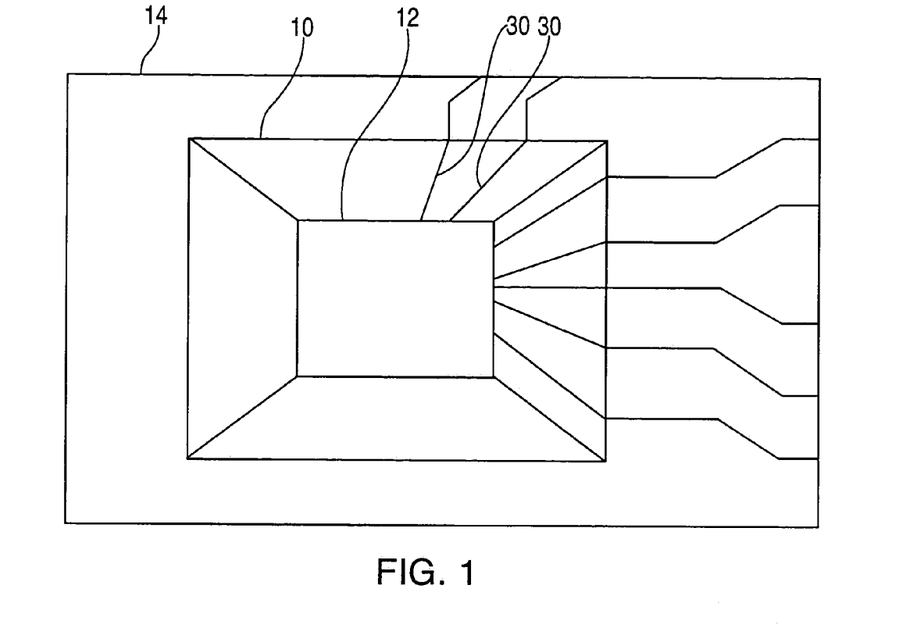
FIG. 1 is a top plan view of an integrated circuit chip mounted to a circuit board using the present invention.
Figures 2, 3:
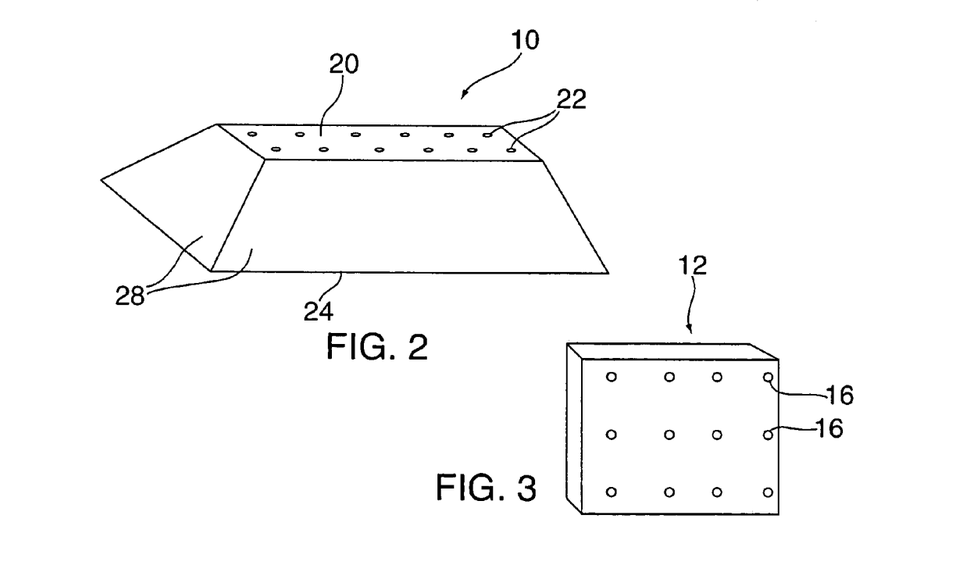
FIG. 2 is a perspective view of a redistribution package according to the present invention.
FIG. 3 is a perspective view of an integrated circuit chip for use with the present invention.
Figure 4:
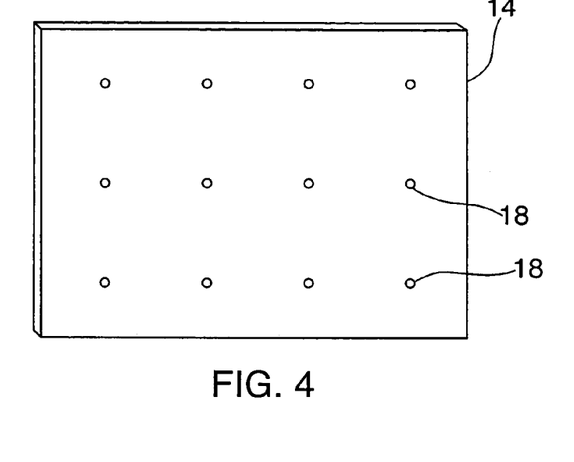
FIG. 4 is a perspective view of a circuit board for use with the present invention.

Referring now to the drawings, wherein like reference numerals refer to like parts throughout, there is seen in FIG. 1 a redistribution package, designated generally by reference numeral 10, for electrically interconnecting an integrated circuit chip 12 to an integrated circuit board 14. Chip 12 is any type of chip that is generally used in the electronics industry and includes a plurality of electrical contacts 16 (see FIG. 3) disposed on its bottom surface, such as for example, C4 connections. Board 14 is a typical integrated circuit board and is provided with a plurality of electrical contacts 18 (see FIG. 4) in a predetermined format, such as in a ball grid array (BGA). As is typical, contacts 16 are arranged in a much finer pitch pattern than are contacts 18. For example, contacts 16 may be spaced apart by about 100 $\mu$m–200 $\mu$m, while contacts 18 may be spaced no less than approximately 1 mm apart. Redistribution package 10 provides effective electrical interconnection between respective pairs of contacts 16 and 18.

With reference to FIGS. 1–5, redistribution package 10 generally comprises a truncated pyramidal shaped body defined by an upper surface 20 with a plurality of contacts 22 disposed thereon, a lower surface 24 with a plurality of contacts 26 (see FIG. 6) disposed thereon, and sidewalls 28 that slope inwardly from bottom surface 24 to upper surface 20. In its preferred embodiment, upper surface 20 and lower surface 24 have generally rectangular peripheral edges and extend in planes that are held in spaced, parallel relation to one another by sidewalls 28.

Figure 5:
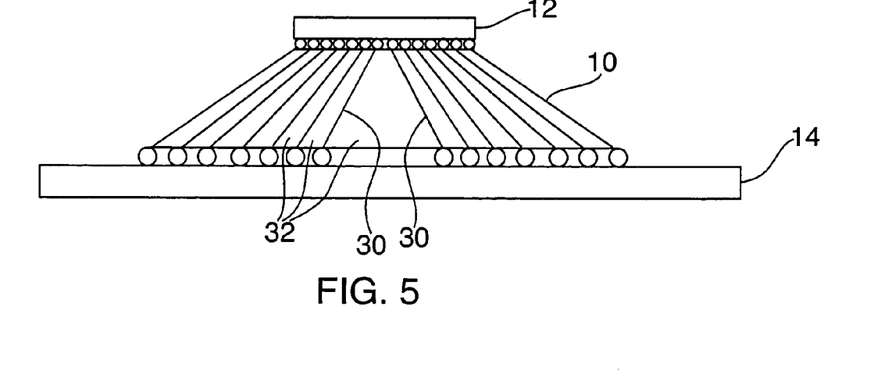
FIG. 5 is a side elevation view of an integrated circuit chip mounted to a circuit board using the present invention.

In order to provide effective and accurate electrical conductance between contacts 18 and contacts 16, contacts 22 formed on upper surface 20 are arranged in essentially the same manner as contacts 16, while contacts 26 formed on lower surface 24 are arranged in essentially the same manner as contacts 26. In order to electrically interconnect respective pairs of contacts 22 and 26, a plurality of conductors 30 extend through package 10, as seen in FIG. 5. Due to the shape of package 10, i.e., pyramidal, conductors 30 extend at various oblique angles between respective pairs of contacts 22 and 26 for reasons that will be more fully explained hereinafter.

Figure 6:
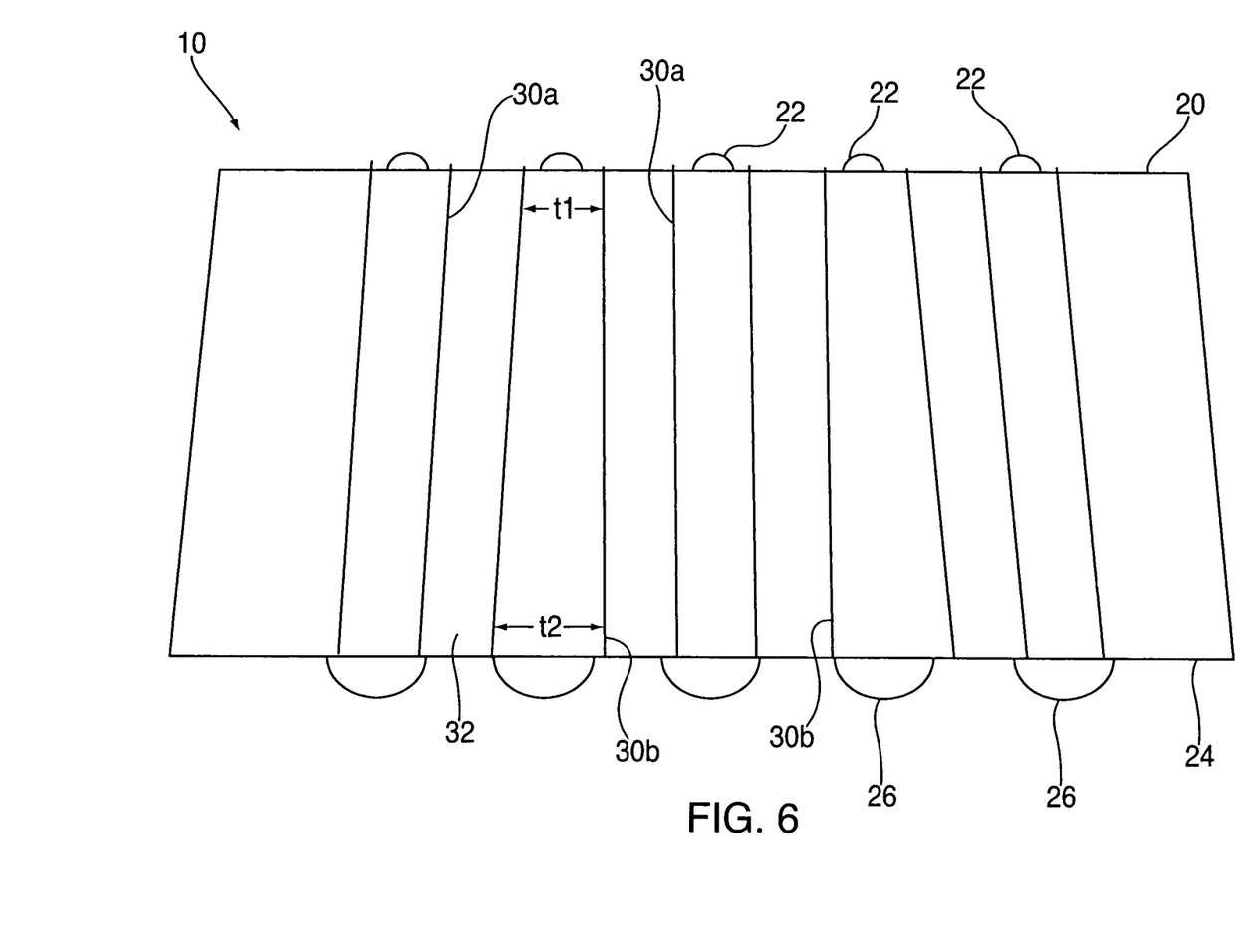
FIG. 6 is a side elevation view taken in section of a redistribution package according to the present invention.

With reference to FIG. 6, to maintain signal integrity and prevent unwanted noise, conductors 30 are separated from one another by dielectric material 32. Each conductor 30 electrically interconnects one of contacts 22 to a corresponding one of contacts 26; that is, a contact 22 in the first row and first column of the grid of contacts 22 will be interconnected to a contact 26 that is in the first row and first column of the grid of contacts 26.

The pyramidal shape of package 10 permits conductors 30 to extend in two dimensions along essentially straight paths (i.e., the conductors extend along an inclined path or slope). The degree of inclination of a conductor 30 will vary depending on its proximity to the center of package 10. For instance, a conductor 30 that is near the edge of package 10 (i.e., a conductor interconnecting contacts 22 and 26 that are at or near the edge of upper and lower surfaces 20 and 24, respectively) will have a less vertical angular inclination than will a conductor that is positioned more towards the center of package 10 (at the geometric center of package 10, the conductor would essentially be vertical).

Conductors 30 may be either signal carrying conductors 30a, ground conductors 30b, or power conductors 30c (see FIGS. 6, 7), that provide signal, ground and power connections between contacts 22 and 26, respectively. It is advantageous to arrange the signal 30a, ground 30b and power 30c conductors in a manner that minimizes noise and interference.

Figure 7:
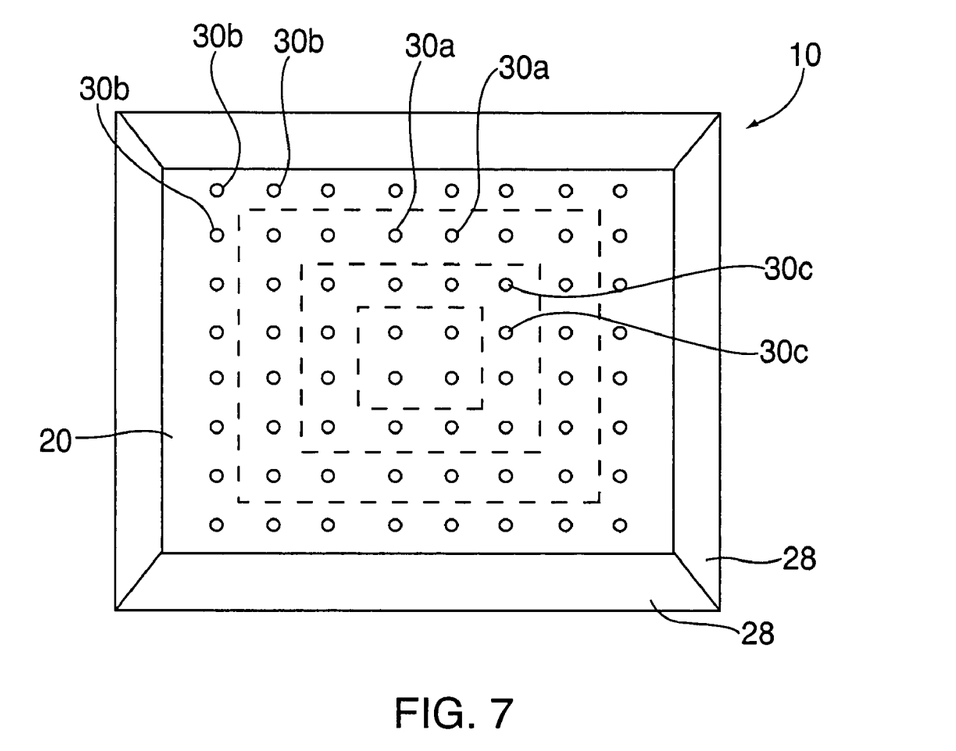
FIG. 7 is a top plan view of a redistribution package according to one embodiment of the present invention.

In one embodiment, as seen in FIG. 7, a plurality of concentric rings of conductors 30 are arranged, with each ring comprising entirely signal conductors 30a, ground conductors 30b, or power conductors 30c. For example, the outermost concentric ring might comprise ground conductors 30b with the next inner ring comprising signal conductors 30a, and the next inner ring comprising power conductors 30c. Other concentric rings formed in package 10 are comprised entirely of one type of conductor 30 (i.e., signal conductors 30a, ground conductors 30b, or power conductors 30c), and may alternate in any order. It is advantageous for signal integrity that each ring of signal conductors 30a be positioned between a ring of ground conductors 30b and a ring of power conductors 30c.

Figure 8:
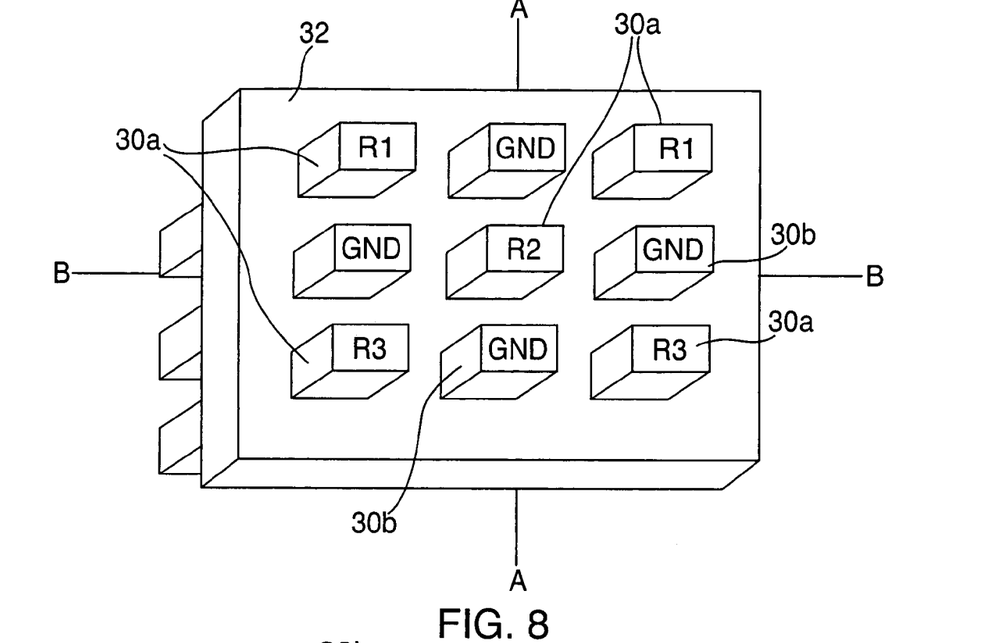
FIG. 8 is a partial, perspective view taken in section of a redistribution package according to a second embodiment of the present invention.
Figure 9:
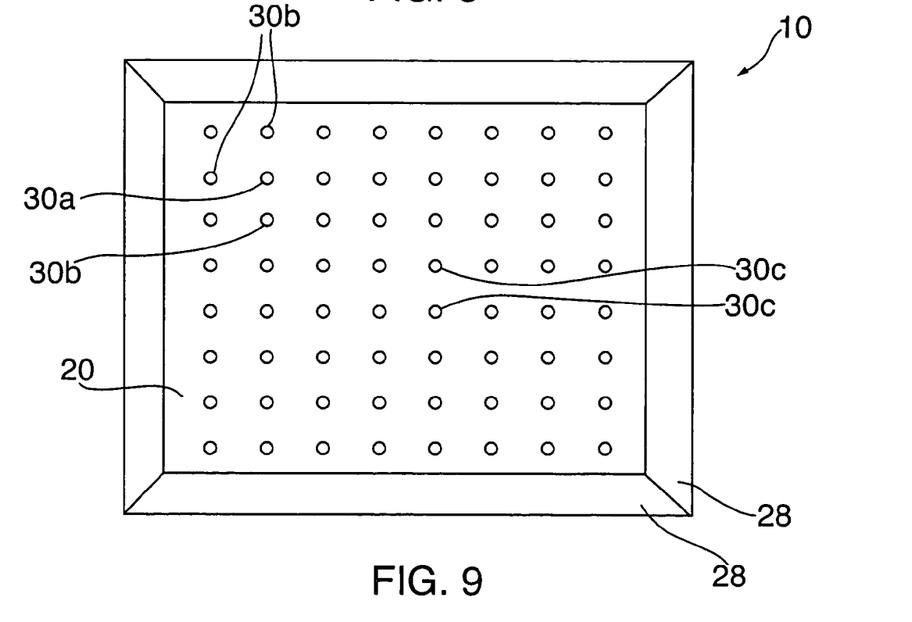
FIG. 9 is a top plan view of a redistribution package according to a third embodiment of the present invention.

In another embodiment, each signal conductor 30a is surrounded on all four sides by a ground conductor 30b, as illustrated in FIGS. 8–9 (referred to as microstrip architecture or straight line redistribution), with the conductors being aligned along planes defined by axes A—A and B—B. To maintain a constant impedance along the length of signal conductors 30a, and due to the angle of inclination at which the conductors extend, the cross-sectional dimensions of the ground conductors 30b must increase from upper surface 20 (represented by t1) towards lower surface 24 (represented by t2) to maintain a constant distance from adjacent signal conductors 30a, as seen in FIG. 6. Maximum utilization of signal wiring channels in this embodiment may be achieved by positioning signal conductors 30a in the outermost concentric ring and surrounding each signal conductor 30a on three sides by ground conductors 30b. According to this embodiment, power may be supplied to chip 12 by a concentric ring of power conductors 30c, or by at least one power conductor 30c positioned within the grid of conductors 30.

Figure 10:
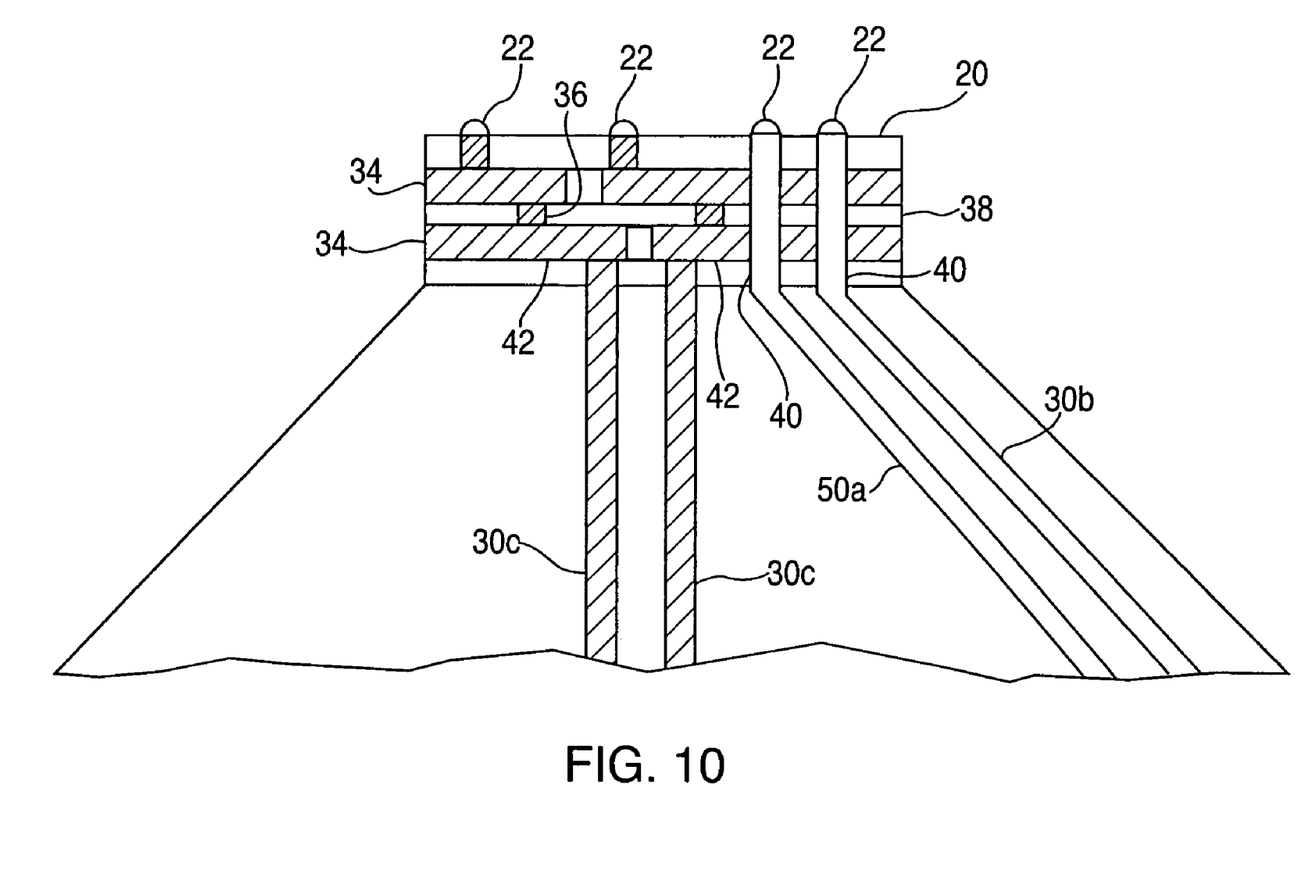
FIG. 10 is a partial side elevation view taken in section of an integrated circuit chip mounted to a circuit board using a fourth embodiment of the present invention.

In a further embodiment of the present invention, as shown in FIG. 10, power is distributed to chip 12 by means of at least one power layer 34. Each power layer 34 is in a plane that is essentially parallel to and coextensive with upper surface 20. Each power layer 34 is comprised of at least one power reference metal 42. Power is provided to power layer 34 by at least one power conductor 30c positioned within the conductor grid, or by a separate power structure. If there is more than one power layer 34, power is transmitted between them by means of power vias 36 that interconnect like power reference metals 42 on the various power layers. Power layer 34 is isolated from signal conductors 30a and ground conductors 30b by one or more layers of dielectric material 38. According to this embodiment, upper contacts 22 are connected to signal conductors 30a and ground conductors 30b by vias 40 that extend through and are isolated from power layer 34.

Integrated circuit chips may require power to be provided in a plurality of voltages. In the preferred embodiment, a plurality of voltages can be supplied to an integrated circuit chip through redistribution package 10 by providing at least one distinct power conductor 30c for each distinct voltage that is required for operation of the integrated circuit chip. In an alternate embodiment of redistribution package 10 that contains a power layer 34, a plurality of voltages can be supplied to an integrated circuit chip through redistribution package 10 by providing at least one distinct power conductor 30c and at least one distinct power reference metal 42 for each distinct voltage required for operation of the integrated circuit chip.

While there has been illustrated and described what are at present considered to be preferred and alternate embodiments of the present invention, it should be understood and appreciated that modifications may be made by those skilled in the art, and that the appended claims encompass all such modifications that fall within the full spirit and scope of the present invention.

What is claimed is:

1. A redistribution package for connecting an integrated circuit chip to a circuit board, comprising:
   a) an upper surface extending in a first plane and including a plurality of upper contacts disposed thereon for electrically interconnecting said upper surface to the integrated circuit chip;
   b) a lower surface extending in a second plane and including a plurality of lower contacts disposed thereon for interconnecting the redistribution package to the circuit board;
   c) a plurality of conductors extending angularly through the redistribution package and interconnecting each of said plurality of upper contacts to corresponding ones of said plurality of lower contacts; and
   d) a power layer incorporated in the redistribution package for distributing power to the integrated circuit chip.

2. The redistribution package of claim 1, wherein said plurality of conductors includes signal carrying conductors, ground conductors and power conductors.

3. The redistribution package of claim 2, wherein said signal carrying conductors, said ground conductors, and said power conductors are positioned in respective concentric rings in all planes parallel to said first plane.

4. The redistribution package of claim 2, wherein each of said signal carrying conductors is surrounded by a plurality of ground conductors.

5. The redistribution package of claim 4, wherein each ground conductor is of a first cross-sectional width and a first cross-sectional thickness at a position adjacent to said upper surface and a second cross-sectional width and a second cross-sectional thickness at a position adjacent to said lower surface, wherein said first cross-sectional width is less than said second cross-sectional width and said first cross-sectional thickness is less than said second cross-sectional thickness.

6. The redistribution package of claim 1, wherein said first and second planes are essentially parallel to one another.

7. A redistribution package for connecting an integrated circuit chip to a circuit board, comprising:
   a) an upper surface extending in a first plane and including a plurality of upper contacts disposed thereon for electrically interconnecting said upper surface to the integrated circuit chip;
   b) a lower surface extending in a second plane and including a plurality of lower contacts disposed thereon for interconnecting the redistribution package to the circuit board;
   c) at least one power layer essentially parallel to and coextensive with said upper surface for distributing power to the integrated circuit chip;
   d) a power structure for providing power to said power layer;
   e) a plurality of vias connected to said upper contacts each of which is electrically isolated from and extends through said power layer; and
   f) a plurality of conductors extending through the redistribution package at a plurality of angles and interconnecting each of said plurality of vias to a corresponding one of said plurality of lower contacts, said plurality of conductors comprising signal conductors and ground conductors.

8. The redistribution package of claim 7, wherein said power structure comprises a plurality of power conductors.

9. The redistribution package of claim 7, wherein said at least one power layer includes at least two power layers.

10. The redistribution package of claim 9, further comprising at least one power via interconnecting said at least two power layers.

11. The redistribution package of claim 7, wherein said plurality of conductors includes signal carrying conductors, ground conductors and power conductors.

12. The redistribution package of claim 11, wherein said signal carrying conductors, said ground conductors, and said power conductors are positioned in respective concentric rings in all planes parallel to said first plane.

13. The redistribution package of claim 1, wherein each of said signal carrying conductors is surrounded by a plurality of ground conductors.

14. The redistribution package of claim 13, wherein each ground conductor is of a first cross-sectional width and a first cross-sectional thickness at a position adjacent to said upper surface and a second cross-sectional width and a second cross-sectional thickness at a position adjacent to said lower surface, wherein said first cross-sectional width is less than said second cross-sectional width and said first cross-sectional thickness is less than said second cross-sectional thickness.

15. The redistribution package of claim 7, wherein said first and second planes are essentially parallel to one another.

* * * * *

UNITED STATES PATENT AND TRADEMARK OFFICE
CERTIFICATE OF CORRECTION

PATENT NO. : 6,945,791 B2
DATED : September 20, 2005
INVENTOR(S) : Timothy W. Budell et al.

It is certified that error appears in the above-identified patent and that said Letters Patent is hereby corrected as shown below:

<u>Column 6,</u>
Line 1, delete "1" and subsitute therefor -- 11 --.

Signed and Sealed this

Eighth Day of November, 2005

JON W. DUDAS
*Director of the United States Patent and Trademark Office*